(12) United States Patent
Weiss et al.

(10) Patent No.: US 7,432,577 B1
(45) Date of Patent: Oct. 7, 2008

(54) SEMICONDUCTOR COMPONENT FOR THE DETECTION OF RADIATION, ELECTRONIC COMPONENT FOR THE DETECTION OF RADIATION, AND SENSOR SYSTEM FOR ELECTROMAGNETIC RADIATION

(75) Inventors: Tilman Weiss, Berlin (DE); Christoph Thiedig, Berlin (DE); Stefan Langer, Zeuthen (DE); Oliver Hilt, Schoeneiche (DE); Hans Georg Koerner, Frankfurt an der Oder (DE); Sebastian Stahn, Berlin (DE); Stephan Swientek, Wildau (DE)

(73) Assignee: Satronic AG, Dielsdorf (CH)

( * ) Notice: Subject to any disclaimer, the term of this patent is extended or adjusted under 35 U.S.C. 154(b) by 220 days.

(21) Appl. No.: 10/110,805

(22) PCT Filed: Oct. 10, 2000

(86) PCT No.: PCT/DE00/03727

§ 371 (c)(1),
(2), (4) Date: Sep. 8, 2004

(87) PCT Pub. No.: WO01/27571

PCT Pub. Date: Apr. 19, 2001

(30) Foreign Application Priority Data

Oct. 15, 1999 (DE) ............................... 199 51 207

(51) Int. Cl.
*H01L 31/00* (2006.01)
*H01L 47/00* (2006.01)
(52) U.S. Cl. .......................... 257/449; 257/4; 257/453
(58) Field of Classification Search ................ 257/449, 257/451, 453, 454, 471–473, 3, 4, E31.024, 257/E31.027, E31.029, E31.087, E31.093
See application file for complete search history.

(56) References Cited

U.S. PATENT DOCUMENTS 5,446,286 A  8/1995  Bhargava

FOREIGN PATENT DOCUMENTS

| DE | 43 06 407 A | 9/1994 |
|---|---|---|
| DE | 199 51 207 A | 4/2001 |
| EP | 0364597 A1 | 4/1990 |
| EP | 0364597 B1 | 4/1990 |
| EP | 1017110 A1 | 7/2000 |
| JP | 03 241777 A | 10/1991 |
| JP | 09 325068 A | 12/1997 |
| WO | WO 9400887 | 1/1994 |

OTHER PUBLICATIONS

International Search Report of PCT/DE00/03727, dated May 14, 2001.
International Preliminary Examination Report of PCT/DE00/03727, dated Apr. 15, 2002.
Sou, et al. "Photoresponse stideis of ZnSSe visible-blind ultraviolet detectors: a comparison to ZnSTe detectors," Applied Physics Letters, dated Dec. 6, 1999, pp. 3707-3709, vol. 75, No. 23, US, American Institute of Physics. New York, U.S.A.

*Primary Examiner*—Hung Vu
(74) *Attorney, Agent, or Firm*—Christie, Parker & Hale, LLP (57) ABSTRACT

A semiconductor component for detecting electromagnetic radiation includes a contact between a metal and a semiconductor. The semiconductor has at least one metal-chalcogenide compound semiconductor as an optical absorbing material or is configured completely from said semiconductor. This allows a cost-effective component to be produced which reacts to electromagnetic radiation in a specifically defined manner. The semiconductor component can be used in an electronic component and a sensor system. A method is also described for producing a semiconductor component by bringing a substrate into contact with a solution, in which a precursor of metal-chalcogenide compound semiconductor is dissolved and/or suspended.

25 Claims, 3 Drawing Sheets

SEMICONDUCTOR COMPONENT FOR THE DETECTION OF RADIATION, ELECTRONIC COMPONENT FOR THE DETECTION OF RADIATION, AND SENSOR SYSTEM FOR ELECTROMAGNETIC RADIATION

CROSS-REFERENCE TO RELATED APPLICATION

This application claims priority of International application number PCT/DE00/03727, filed October 13, 2000, which in turn claims priority of German application number 199 51207.8, filed Oct. 15, 1999.

FIELD OF THE INVENTION

The invention relates to a semiconductor component, an electronic component, a sensor system and a method for fabricating a semiconductor component.

BACKGROUND

Semiconductor components for the detection of electromagnetic radiation made from single-crystal silicon, single-crystal compound semiconductors or from silicon carbide, are known. Drawbacks of these components are in particular the high costs involved in the fabrication of the single-crystal material.

Silicon is also sensitive to a wide spectral range of electromagnetic radiation (near IR to UV radiation). Since in many technical application areas radiation occurs over a wide range of wavelengths, measurement results, for example, are distorted for certain radiation ranges.

In addition to elemental semiconductors, compound semiconductors, such as for example, gallium arsenide, are also known. These compound semiconductors are also difficult to process.

DE 43 06 407 A1 has disclosed a detector for electromagnetic radiation, in which highly porous titanium dioxide is used as support material for a liquid electrolyte and a dye. A drawback of this is the use of a two-phase (solid-liquid) detector, which causes difficulties in fabrication.

SUMMARY

The present invention is based on the object of providing a semiconductor component for the detection of electromagnetic radiation which can be fabricated at low cost and reacts in a particularly defined way to electromagnetic radiation. A further object is to provide an electronic component and a sensor system having a semiconductor component of this type, and also a method for fabricating the semiconductor component.

A Schottky contact is produced by fabricating a contact between a metal and a semiconductor.

This contact is responsible for separating the charge carrier pairs which are produced in the semiconductor when electromagnetic radiation (e.g. UV radiation) is introduced.

Since the semiconductor includes at least one metal chalcogenide compound semiconductor as optical absorber material or consists entirely of this metal chalcogenide, the semiconductor is easier to process than silicon or other compound semiconductors, so that a component of this type is less expensive to fabricate. It also means that it is not necessary to use a liquid phase. The use of at least one metal chalcogenide compound semiconductor also means that electromagnetic radiation is not detected in certain wavelength regions (e.g. visible light), so that this region is excluded. Consequently, this region cannot have an adverse effect on the measurement of radiation in a different wavelength region (e.g. UV radiation).

A semiconductor which includes a mixture of at least two metal chalcogenide compound semiconductors or a layer sequence comprising at least two metal chalcogenide compound semiconductors is advantageous.

In one embodiment, a first metal chalcogenide compound semiconductor has a high radiation absorption capacity, and a second metal chalcogenide compound semiconductor has a high charge carrier conductivity. Since a compound semiconductor often does not combine all the required properties (e.g. good optical absorption properties, good conductivity), an improved overall effect can be achieved by a combination of different metal chalcogenide compound semiconductors.

In another embodiment, at least one semiconductor is a metal chalcogenide compound semiconductor including $TiO_2$, $ZnO$, $ZnS$, $MgS$, $SnO_2$, $SiO_2$, $ZrO_2$, $PbO$, $NiO$, $Nb_2O_5$, $Ta_2O_5$, $Fe_2O_3$ or $In_2O_3$, since these compound semiconductors can be easily fabricated. These metal chalcogenide semiconductors can also be used in any desired mixtures with one another in the semiconductor component according to the invention.

In a further embodiment of the semiconductor component according to the invention, at least one semiconductor has a selective sensitivity for electromagnetic radiation with a wavelength of less than 400 nm. It is particularly advantageous if at least one semiconductor has a maximum selectivity for electromagnetic radiation in the wavelength region between 300 and 360 nm. This allows efficient detection of UV radiation.

In one embodiment of the semiconductor component according to the invention, the semiconductor is arranged as semiconductor layer on a substrate.

In a further embodiment, at least one interlayer is arranged between the semiconductor layer and the substrate.

The semiconductor layer can have a layer thickness of less than 1 μm. It is also advantageous if the semiconductor layer substantially has a grain size of less than 20 nm, in particular less than 10 nm. The grain size is a measure of the porosity or roughness of the semiconductor layer. A smooth, nonporous surface is of particular importance, since a porous surface at the transition to the metal layer would make charge transport more difficult in this region.

It is particularly advantageous if the surface of the semiconductor layer is optically smooth. This also ensures particularly good contact with adjoining layers.

In another embodiment, the semiconductor layer is conductively connected to an electrical contact layer. This makes it possible to achieve a particularly compact overall form.

Furthermore, to increase the number of charge carriers, the semiconductor layer can be doped with niobium and/or tantalum.

The metal in the Schottky contact can be a metal having a particularly high work function, such as platinum, palladium, nickel, gold or silver.

In one embodiment, the metal is arranged as metal layer on the semiconductor layer. In this way, it is possible for a semiconductor component having a large surface area to be designed in particularly compact form.

In a further embodiment of the semiconductor component, the metal layer is transparent to electromagnetic radiation. As a result, the sensitive part of the space charge region, which lies in the boundary region between metal layer and semiconductor layer, is irradiated. A transparent metal layer represents a compromise between the required conductivity and the necessary transparency.

The semiconductor layer can be conductively connected to an electrical contact layer. The contact layer can also include or be formed from fluorine-doped $SnO_2$, $SnO_2/In_2O_3$, ZnO, aluminum-doped ZnO, zinc or aluminum, since this produces particularly good conduction properties in the region of the contact layer and semiconductor layer. The high quality of the surface (i.e. small grain size, low porosity) of the semiconductor layer ensures a particularly good charge transfer to the contact layer.

In one embodiment, the substrate is formed from metal, which then, including its own oxide, forms a conductive back contact. A compact arrangement of this nature makes the component easy to install in an appliance e.g. a measurement appliance.

In one embodiment, the semiconductor component is constructed in such a way that a conductive contact layer is arranged on the substrate, a semiconductor layer, in particular a $TiO_2$ layer as semiconductor layer is arranged on the contact layer, and a platinum layer as metal layer is arranged on the semiconductor layer. A structure of this type makes it possible to produce a back contact which can be connected directly and to use the entire component surface as an optically active Schottky contact. A structure of this type is compact and inexpensive to produce and has a high sensitivity with respect to UV radiation and a low sensitivity with respect to visible light.

A platinum layer can also be the metal layer to be arranged on the substrate, a semiconductor layer, in particular a $TiO_2$ layer as semiconductor layer can be arranged on the metal layer, and a transparent contact layer can be arranged on the semiconductor layer. With a layered arrangement of this type, the substrate simultaneously serves as a viewing and protective window, making it easier to integrate the semiconductor component into other appliances.

A further embodiment has, as the substrate, a glass body, in particular made from quartz glass, having at least one planar surface. It is easy to apply coatings to the at least one planar surface. Quartz glass is highly transmissive to UV radiation.

In one embodiment, a semiconductor component has a substrate which is transparent to UV radiation.

It is advantageous if, when the semiconductor component according to the invention is irradiated with electro-magnetic radiation, a current flows between the metal and the electrical contact layer in the semiconductor component. The flow of current or the voltage which is thereby generated can be used to measure the incident electromagnetic radiation.

The object is also achieved by an electronic component. The use of a semiconductor component having a compound semiconductor results in an electronic component, for example to be arranged on a printed circuit board, which can be fabricated at low cost and has a selective sensitivity for electromagnetic radiation.

Furthermore, the object is achieved by a sensor system for electromagnetic radiation in accordance with the invention. The use of a semiconductor component having a metal chalcogenide compound semiconductor makes it possible to detect electromagnetic radiation in a defined region. In particular, it is advantageous if the semiconductor is sensitive to UV radiation.

A sensor system for the detection of UV radiation can be used in numerous sectors. For example, for safety reasons, the flame has to be monitored in heating installations. For this purpose, the UV radiation in the combustion chamber is measured. The spectral distribution of the UV radiation provides an indication of the quality of combustion. A sensor system of this type can be used to control the air excess coefficient in a heating installation.

Since, however, considerable fractions of radiation in the visible and IR region also always originate from the combustion chamber, it is particularly advantageous if the sensor system has a high selectivity for UV radiation. This selectivity is also important in other application areas, such as for example for measuring UV radiation in solariums, for investigating the artificial aging of material specimens, for food stuff inspections, spectroscopic testing or water treatment using UV rays.

In this context, it is particularly advantageous if the maximum sensitivity of the semiconductor lies in a wavelength region from 300 to 360 nm. It is also advantageous if the semiconductor is insensitive to visible light, in particular with wavelengths of over 400 nm, and/or IR radiation.

It is a particularly advantageous configuration of the sensor system according to the invention if it is arranged in a portable appliance, in particular a handheld appliance, a wearable watch, a badge or a bicycle computer. This means that a portable and inexpensive appliance is available, allowing, for example, the UV radiation to be measured when sunbathing on the beach or in the solarium.

In this context, it is advantageous if the sensor system has a means for recording a cumulative dose of radiation, which can be used to record the received dose of radiation. It is particularly advantageous if an assessment means determines a difference between the cumulative dose of radiation and a predeterminable value for a dose of radiation, since it is possible to assess, on the basis of this difference, whether a set limit value has been exceeded. The evaluation means advantageously optically and/or acoustically indicates the difference automatically in order, for example, to notify a user that a limit value has been exceeded or undershot.

It is particularly advantageous if the evaluation means detects measured outliers of the dose of radiation. Such outliers may, for example, in the case of irradiation with UV light, indicate an excessive load on the skin. To avoid distortion to the cumulative dose of radiation, it is advantageous if the evaluation means does not take account of the outliers when adding up the cumulative dose of radiation. Particularly in the case of UV radiation, a long-term deficit cannot be compensated for by brief, intensive irradiation.

In a further advantageous refinement of the sensor system according to the invention, the evaluation means has a correction means for converting the actual incident radiation cross section of the sensor system into an incident radiation cross section of a person. This, for example, enables the sensor system to be arranged in a watch, yet still to make a statement about the exposure of the person wearing the watch to radiation.

In one embodiment, a substrate is brought into contact with a solution in which a precursor of at least one metal chalcogenide compound semiconductor is dissolved and/or suspended. It can thereby be easy to apply a semiconductor layer to the substrate. In this context, the term substrate can additionally refer to an object which has already been coated with another layer (e.g. TCO) before being brought into contact with the solution, so that methods according to the invention apply the coating to the substrate directly and/or to the existing coating of the substrate. In the present context, the term precursor is understood as meaning a substance which, after at least one chemical reaction and/or at least one physical treatment (e.g. heating), forms a metal chalcogenide compound semiconductor.

The substrate can be successively brought into contact with at least two different precursor solutions, since this allows various coatings to be combined.

The solution can also contain at least one precursor of the metal chalcogenide compound semiconductor $TiO_2$, ZnO, ZnS, MgS, $SnO_2$, $SiO_2$, $ZrO_2$, PbO, NiO, $Nb_2O_5$, $Ta_2O_5$, $Fe_2O_3$ or $In_2O_3$. It is also advantageous if at least one precursor is in the form of a metal alkoxide or metal chloride.

The solution can contain at least one alcohol and/or water, in order to allow good dissolution and deposition of the compound semiconductor.

Furthermore, a layer of a metal oxide compound semiconductor can be produced by oxidation, in particular in ambient air, of the surface of a metallic substrate. An oxide of the metal of the substrate can easily be produced in this way. For example, if a zinc plate is used as substrate, the zinc oxide which forms would serve as the metal chalcogenide compound semiconductor. The zinc plate could then be used as a back contact.

The substrate and solution can be brought into contact by a dip coating or spin coating process. In the case of the dip coating process, a layer is applied to the substrate by dipping the substrate into the solution and drawing it out of the solution. In the case of the spin coating process, the solution is applied to a rotating substrate. Both processes allow the substrate to be coated with a high surface quality and a high degree of uniformity.

In order to be coated, the substrate can also be drawn out of the solution at a predeterminable draw-out rate. In this case, it is advantageous if the draw-out rate is constant. It is particularly advantageous if the draw-out rate of the substrate is less than 3 mm/s. A particularly high surface quality of the semiconductor layer can thereby be produced, which is important for good charge transfers to the Schottky metal layer, which is in conductive contact with the semiconductor layer.

To allow uniform coating of the substrate, it is advantageous for the substrate to be drawn out of the solution using a controllable device.

A hydrolysis reaction can take place between the precursor on the substrate and atmospheric humidity, in order to produce a metal oxide semiconductor layer. In the process, alcohol and/or the water on the substrate is/are evaporated.

When forming a sulfide layer, the sulfiding reaction can take place between the precursor on the substrate and the hydrogen sulfide.

After the hydrolysis reaction and/or after the sulfiding reaction, the coated substrate can undergo intermediate conditioning for a predeterminable time, in which case it is particularly advantageous if the intermediate conditioning is carried out at 200° C. to 500° C. The intermediate conditioning can advantageously last for between 1 min and 20 min.

After the intermediate conditioning, it is advantageous for the coated substrate to be cooled.

For a metal oxide semiconductor layer to be deposited on the substrate, it is advantageous to repeat the operation of drawing the substrate out of the solution, the hydrolysis reaction and the intermediate conditioning at least twice, since this results in a uniform semiconductor layer of the desired thickness. In this context, it is advantageous for the coating to be continued until the thickness of the semiconductor layer is between 100 nm and 1 μm.

After the coating operation has ended, it is advantageous for the substrate to be conditioned in a furnace at temperatures of between 400° C. and 700° C. It is particularly advantageous for the conditioning to last between 1 h and 3 h.

Advantageously, a contact layer is arranged on the substrate before it is bought into contact with the solution and a metal layer is arranged on the semiconductor layer after the conditioning. A different coating sequence, namely with a metal layer being arranged on the substrate before it is brought into contact with the solution and a contact layer being arranged on the semiconductor layer after conditioning, is also advantageous.

The metal layer advantageously consists of platinum, palladium, nickel, gold or silver. It is advantageously applied by sputtering, electron-beam evaporation or an electrolysis process.

The coating with the metal layer advantageously takes place to a layer thickness of 20 nm.

It is particularly advantageous if a glass body having at least one planar surface is used as substrate in a method according to the invention. Coatings can be applied to the at least one planar surface in a particularly successful and simple way.

BRIEF DESCRIPTION OF THE DRAWINGS

The invention is explained in more detail below with reference to the drawing and on the basis of a plurality of exemplary embodiments, in which.

DETAILED DESCRIPTION

Figure 1:
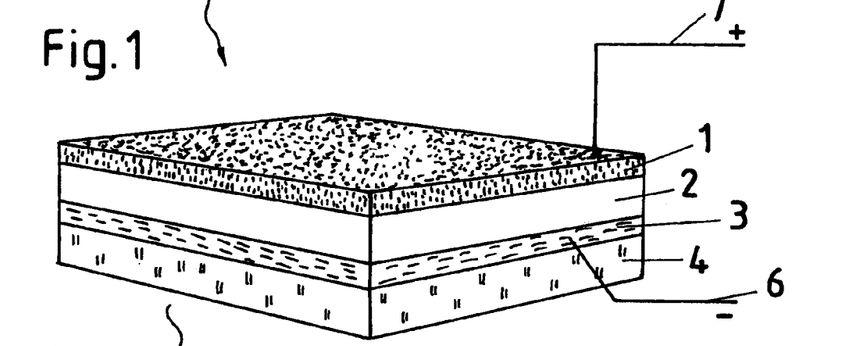
FIG. 1 diagrammatically depicts a three-dimensional view of a first embodiment of a semiconductor component according to the invention.

FIG. 1 illustrates a three-dimensional view of an embodiment of a semiconductor component according to the invention which is used in a UV sensor system.

The semiconductor component has a plurality of parallel layers 1, 2, 3 which are arranged on a substrate 4. The substrate 4 used in this case is float glass with two planar surfaces.

A contact layer 3 of tin oxide as TCO (transparent conducting oxide) is arranged on the substrate 4 as electrical contact. The tin oxide ($SnO_2$) is doped with fluorine. In an alternative configuration, the contact layer 3 is formed from a metal, such as for example zinc, or aluminum.

Alternatively, it is also possible for a metal plate to be used as substrate 4. On the side which is intended to be coated, this metal plate has its own conductive oxide layer as contact layer 3.

A semiconductor layer 2 comprising a metal chalcogenide compound semiconductor as optical absorption medium is arranged on the contact layer 3. In the present case, the semiconductor layer 2 consists of the metal oxide compound semiconductor $TiO_2$; but, other metal chalcogenide compound semiconductors such as ZnO, ZnS, MgS, $SnO_2$, $SiO_2$, $ZrO_2$, PbO, NiO, $Nb_2O_5$, $Ta_2O_5$, $Fe_2O_3$ or $In_2O_3$ can also be used. The metal chalcogenide compound semiconductors serve as optically active media (optical absorber material) and not as merely support material.

Mixtures and/or layered arrangements of at least two of these metal chalcogenide semiconductors are also possible. The semiconductor layer 2 comprising a metal oxide compound semiconductor is used as absorber for incident electromagnetic radiation, in particular UV radiation.

This semiconductor layer 2 of $TiO_2$ is 300 nm thick, transparent in the wavelength region of visible light and has a nanocrystalline anatase structure. The semiconductor layer 2 is visible blind, i.e. the semiconductor layer 2 is not sensitive to electro-magnetic radiation in the wavelength region of visible light (cf. FIG. 5). The semiconductor layer 2 has a particularly compact, planar surface, since in this way the electrical contact properties with a metal layer 1 (cf. below) and the contact layer 3 are improved. The parallel resistance of the diode circuit is also reduced.

This is achieved by a particularly small grain size in the semiconductor layer 2. The grain size of the semiconductor layer 2 is in this case in the region of 10 nm. This results in a particularly large contact surface area with the layer below. A semiconductor layer 2 of this type is also optically smooth. In particular, for example in the case of $TiO_2$, a nonporous layer is transparent while a porous layer scatters light and appears white.

To form a Schottky contact, a metal layer 1 consisting of platinum is applied to the semiconductor layer 2. Alternatively, it is also possible to use gold, palladium, nickel or silver as the metal. The metal layer 1 is 10 nm thick and transmits approximately 20-30% of the UV radiation which impinges on it (arrow A) into the semiconductor layer 2 of $TiO_2$ below it. The remainder of the incident radiation is reflected.

If UV radiation is incident on the semiconductor component according to the invention (arrow A; wavelength less than 400 nm), charge carrier pairs (electrons, holes) are produced in the semiconductor layer 2 by the absorbed radiation. These charge carrier pairs are separated in a boundary region at the space charge zone (Schottky contact) lying between metal layer 1 and the semiconductor layer 2.

The action of the radiation causes a current to flow via a positive terminal 7, which is connected as a gold wire to the metal layer 1, and a negative terminal 6, which is connected to the contact layer 3 by a gold wire.

The size of the substrate 4 is dependent on the intended application, it being possible to coat substrates 4 with surface areas of between one square millimeter and several square meters using the method according to the invention.

In the present example, the size of the substrate 4 is approximately 30 $cm^2$. Abrasive cutting is used to make it into chips with an area of 20 $mm^2$, which can readily be used in a UV sensor system designed as a handheld appliance. In principle, however, it is also possible for semiconductor components according to the invention with considerably larger substrates 4, for example in window panes, to be used. Inexpensive material-machining processes can be used to produce a multiplicity of identical semiconductor components from large substrates 4 of this type.

One possible application for a semiconductor component according to the invention is a UV radiation measuring appliance, which records amounts of radiation which are relevant to health. An appliance of this type is useful since a deficit of UV radiation, as occurs in particular in the winter months, may cause physical and mental ill health.

In this context, it is important that the quantities of radiation should not simply be added, since, for example, an existing deficit cannot be compensated for by brief, intensive irradiation (e.g. sunburn).

Therefore, the sensor system has an evaluation means, as a result of which certain "outliers" (e.g. narrow, high peaks involving brief, high exposure to radiation) are not taken into account when adding up the cumulative dose of radiation. However, these outliers are displayed and stored, in order to provide the user with information about these parameters, which are relevant to health.

The appliance according to the invention displays the cumulative quantity of UV radiation as an actual value. This actual value is compared with a predeterminable desired value. If the difference (actual value)−(desired value)

is negative, i.e. there is a deficit, a corresponding optical and/or acoustic signal is generated. Furthermore, it is advantageous for a positive difference at least to be canceled out and simply for the time at which it starts to be emitted as a signal. Furthermore, it is advantageous for the cumulative addition to be performed daily, in synchronicity with the solar cycle. Furthermore, it is necessary to cancel out all positive differences during the cumulative addition of the daily values. For example, a daily, weekly, monthly or annual balance can be emitted.

The miniature forms of known UV sensors and also of microprocessors makes it possible to provide a UV measuring appliance for the above application in the form of, for example, a wristwatch, a bicycle computer or a sticker. In principle, an inherently analog signal from the UV sensor is digitized and is prepared for the above tasks using hardware corresponding, for example, to that of the bicycle computer.

When a measuring appliance of the type described above is being worn by a user, the measured value does not completely represent the dose of radiation which is actually being received by the user, since the incident radiation cross section of the measuring appliance and of the user are different. The evaluation means takes account of this fact by means of a correction factor which under certain circumstances may also be matched adaptively to the actual incident radiation.

A semiconductor component according to the invention can also be used in an electronic component, which has a wide range of applications.

The following text describes a first method according to the invention, which can be used to fabricate a semiconductor component having a metal oxide compound semiconductor.

For this purpose, in this case the substrate 4 is coated using a dip-coating process. This involves a sol-gel process with hydrolysis and condensation (during the subsequent conditioning).

The following steps are carried out during the fabrication of the semiconductor component.

1. The substrate 4 is in this case a rectangular glass pane with an area of 4 $cm^2$ comprising float glass. One of the two larger side faces of this substrate 4 has in this case already been coated with a contact layer 3 of fluorine-doped $SnO_2$ as TCO (transparent conduction oxide).
2. The substrate 4 is successively cleaned in ethanol, water and ethanol again, in each case for 5 min, in an ultrasound bath.

To accelerate the subsequent drying, the substrate 4 is then blown dry with a jet of nitrogen.
3. This substrate 4 is then dipped into a solution of 90% of isopropanol and 10% of tetraisopropyl titanate. The dipping time is 2 s, the draw-out rate 5 mm/s. The tetrapropyl titanate is used as precursor for the semiconductor layer comprising the metal oxide compound semiconductor $TiO_2$. As the substrate 4 is being drawn out, a precursor film is deposited on the surface of the substrate.

In alternative embodiments of the method according to the invention, other alcohols, such as methanol, ethanol or butanol are used. It is also possible for other precursor compound semiconductors to be used in the solution.

In other alternative embodiments, the coating is carried out by spin coating. In this case, the substrate 4 is set in rotation, and the solution containing the metal oxide compound semiconductor is applied dropwise to the substrate 4. A thin film is formed on the substrate 4 as a result of the centrifugal forces. The viscosity of the solution which is applied in drops must be slightly higher than in the case of dip coating, so that a uniform layer is formed. The further method steps involved in the previous and subsequent treatment, such as drying, intermediate conditioning and conditioning, take place in a similar manner to the dip coating process.

In another alternative embodiment, the semiconductor layer 2 is applied by spray pyrolysis, in which case a tetraisopropyl titanate and isopropanol solution is sprayed at high pressure onto a substrate 4 which is at a temperature of approx. 200° C. During the evaporation of the solvent, a reaction to form $TiO_2$ takes place. In this case too, the previous and subsequent treatment steps take place in a similar way to the dip coating process. In principle, it is also possible for the coating to be produced using the screen printing process or by means of a sputtering process.

4. The substrate 4 is drawn out of the solution at a constant draw-out rate of 1 mm/s, the tetraisopropyl titanate reacting in air with the atmospheric humidity to form $TiO_2$ (hydrolysis reaction).

5. After it has been drawn out of the solution, the coated substrate 4 undergoes intermediate conditioning for 2 min at approx. 200° C. in a furnace. A condensation reaction takes place, and alcohol adhering to the substrate 4 is evaporated.

6. The method steps 3 to 5 are repeated six times, the substrate being cooled by compressed air after method step 5 and before method step 3.

The substrate 4 is handled with the aid of a computer-controlled 3-axis robot, which ensures particularly precise management of the process parameters (draw-out rate, draw-out time, intermediate conditioning time).

7. After the various dipping operations, the coated substrate 4 is conditioned at approx. 450° C. in a furnace for 2 h.

After the conditioning has ended, the result is a semiconductor layer 2 which has a layer thickness of between 200 nm and 300 nm.

8. After cooling, a metal layer 1 of platinum is applied to the semiconductor layer 2. The layer thickness is 10 nm. The metal layer is applied by sputtering.

In an alternative embodiment of the method according to the invention, the metal layer 1 is applied by an electron-beam evaporation process or an electrolysis process. Other suitable metals for the coating are silver, palladium, nickel or gold.

9. After the coating operations have ended, gold wires are connected to the metal layer 1 and the contact layer 3, in order to be able to tap the voltage which is produced when radiation impinges.

In an alternative embodiment of the method, the substrate 4 is firstly coated with a metal layer 1. Then, a semiconductor layer 2 is applied to this layer using a dip coating or spin coating process. Finally, the contact layer 3 is applied to the semiconductor layer. The above method steps for coating with the metal oxide compound semiconductor are used in a similar way, with the method steps for the application of the metal layer preceding these steps.

Also, in a second embodiment of the method according to the invention, dip coating is also used to coat the substrate 4. This involves a sol-gel process with hydrolysis and condensation for the oxide components and heterogeneous sulfiding with gaseous hydrogen sulfide for a sulfide component. The basis for the sulfiding is metal salt-containing liquid films which are drawn onto the presented oxide lattice, likewise by means of dip coating. The hydrolysis or sulfiding is terminated by conditioning after each coating process.

The following steps are carried out in this second embodiment for the fabrication of the semiconductor component.

1. The substrate 4 is in this case a square glass pane with an area of approx. 30 $cm^2$ comprising float glass. One side of the substrate has already been coated with a contact layer 3 of fluorine-doped $SnO_2$ as TCO (transparent conduction oxide).

2. The substrate 4 is cleaned for 30 seconds in isopropanol and a wetting agent in an ultrasound bath. The action of the ultrasound is limited to 1 to 5 seconds. At a draw-out rate of 0.5 mm/sec, the cleaned pane leaves the cleaning bath in dry form.

3. This substrate 4 is then dipped into a solution of isopropanol, tetraisopropyl titanate, water and diethanolamine. The dipping time is 2 seconds, the dip-removal rate 1 mm/s. The tetraisopropyl titanate is used as precursor for the semiconductor layer comprising the metal oxide compound semiconductor $TiO_2$. When the substrate 4 is being drawn out, a precursor film is deposited on the surface of the substrate 4.

In alternative embodiments, other alcohols, such as methanol, ethanol or butanol are used. It is also possible for other precursor materials which contain the components of the subsequent semiconductors to be used in the solution.

In other alternative embodiments, the coating is carried out not be dipping but rather by spin coating. In this case, the substrate 4 is set in rotation, and the solution containing the metal oxide compound semiconductor is applied dropwise to the substrate 4. A thin film is formed on the substrate 4 as a result of the centrifugal forces. The viscosity of the solution which is applied in drops must be slightly higher than in the case of dip coating, so that a uniform layer is formed. The further method steps involved in the previous and subsequent treatment, such as drying, intermediate conditioning and conditioning, take place in a similar manner to the dip coating process.

In another alternative embodiment, the semiconductor layer 2 is applied by spray pyrolysis, in which case a tetraisopropyl titanate and isopropanol solution is sprayed at high pressure onto a substrate 4 which is at a temperature of approx. 200° C. During the evaporation of the solvent, a reaction to form $TiO_2$ takes place. In this case too, the previous and subsequent treatment steps take place in a similar way to the dip coating process.

In principle, it is also possible for the coating to be produced using the screen printing process or by means of a sputtering process.

4. During the dip-coating process, the substrate 4 is drawn out of the solution at a constant draw-out rate of 1 mm/s, the tetraisopropyl titanate reacting in air with the atmospheric humidity to form $TiO_2$ (hydrolysis reaction) and forming an optically homogeneous layer.

5. After the dip-removal from the solution, the coated substrate 4 undergoes intermediate conditioning for 20 min at approx. 470° C. in a furnace. In the process, alcohol adhering to the substrate 4 is evaporated.

6. There then follows a dip coating operation with the alcoholic metal salt solution, using the same parameters. In this case, a homogeneous film of this solution adheres to the presented basic lattice. Now, under a gas bell jar, in a similar manner to the hydrolysis reaction, a mixture of nitrogen and hydrogen sulfide is passed over the substrate. In the process, the zinc sulfide which forms grows into the titanium dioxide with its own crystal structure (zinc blende type).
7. Method steps 3 to 6 are repeated six times, the substrate being cooled in stationary air after each conditioning step. The substrate 4 is handled with the aid of a computer-controlled 3-axis robot, which ensures sufficiently accurate management of the process parameters (draw-out rate, draw-out time, intermediate conditioning time).
8. After the various dipping operations, the coated substrate 4 is conditioned at approx. 450° C. in a furnace for 2 hours. After the conditioning has ended, the result is a semiconductor layer 2 which has a layer thickness of between 200 nm and 300 nm.
9. After cooling, a metal layer 1 of platinum is applied to the semiconductor layer 2. The layer thickness is 10 nm. The metal layer is applied by sputtering.

In an alternative embodiment of the method according to the invention, the metal layer 1 is applied by an electron-beam evaporation process or an electrolysis process. Other suitable metals for the coating are silver, palladium, nickel or gold.
10. After the coating operations have ended, gold wires are connected to the metal layer 1 and the contact layer 3, in order to be able to tap the voltage which is produced when radiation impinges.

In an alternative embodiment of the method, the UV-transparent substrate 4 is firstly coated with a transparent metal layer. Then, a semiconductor layer 2 is applied to this layer using a dip coating or spin coating process. Finally, the contact layer is applied to the semiconductor layer. The abovementioned method steps for coating with the metal oxide compound semiconductor are used in a similar way, with the method steps for the application of the metal layer preceding these steps.

Figure 2:
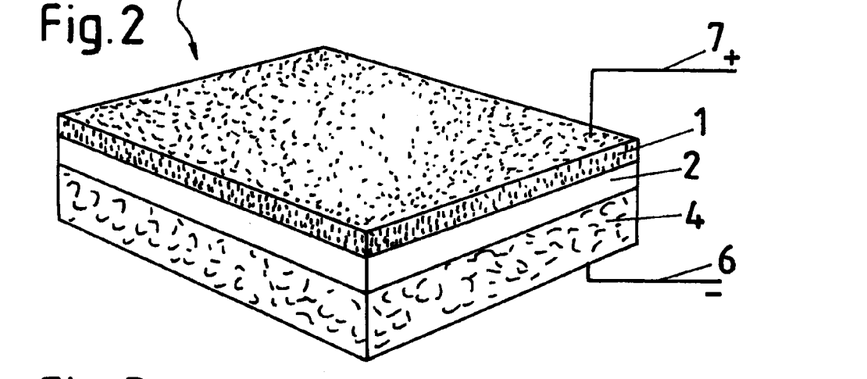
FIG. 2 diagrammatically depicts a three-dimensional view of a second embodiment of a semi-conductor component according to the invention.

FIG. 2 shows another embodiment of the semiconductor component according to the invention. As a modification to the subject illustrated in FIG. 1, in this case there is no contact layer arranged between the semiconductor layer 2 and the substrate 4. The substrate 4 in this case consists of metal which, by its nature, has an oxide layer. This is conductive, and consequently there is no need for a separate contact layer.

Figure 3:
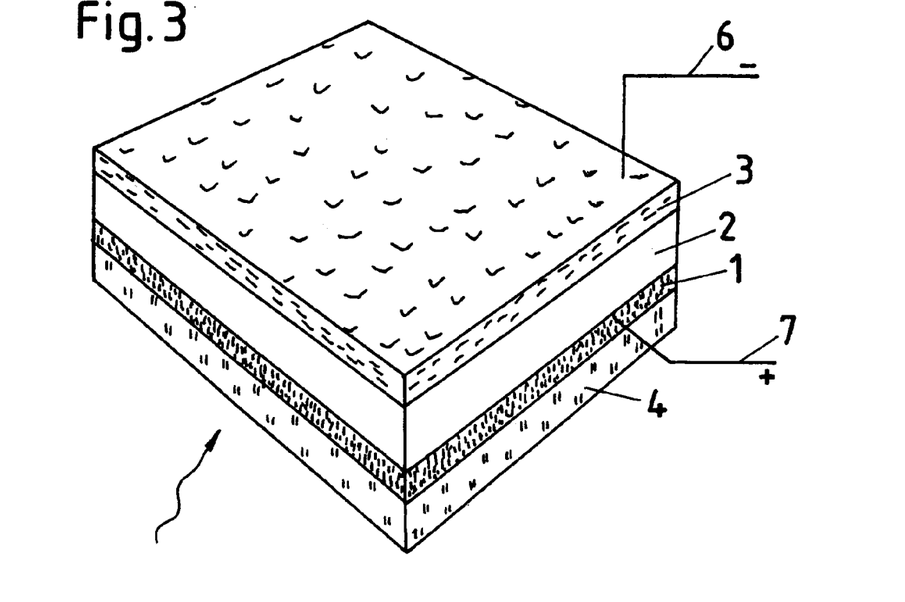
FIG. 3 diagrammatically depicts a three-dimensional view of a third embodiment of a semiconductor component according to the invention.

FIG. 3 shows another embodiment, in which the order of the metal layer 1 and of the contact layer 3 is reversed compared to the first embodiment, i.e. the metal layer 1 is arranged on the substrate 4. The semiconductor layer 2 is then arranged above the metal layer 1 and then the contact layer 3 is arranged on the semiconductor layer.

Figure 4:
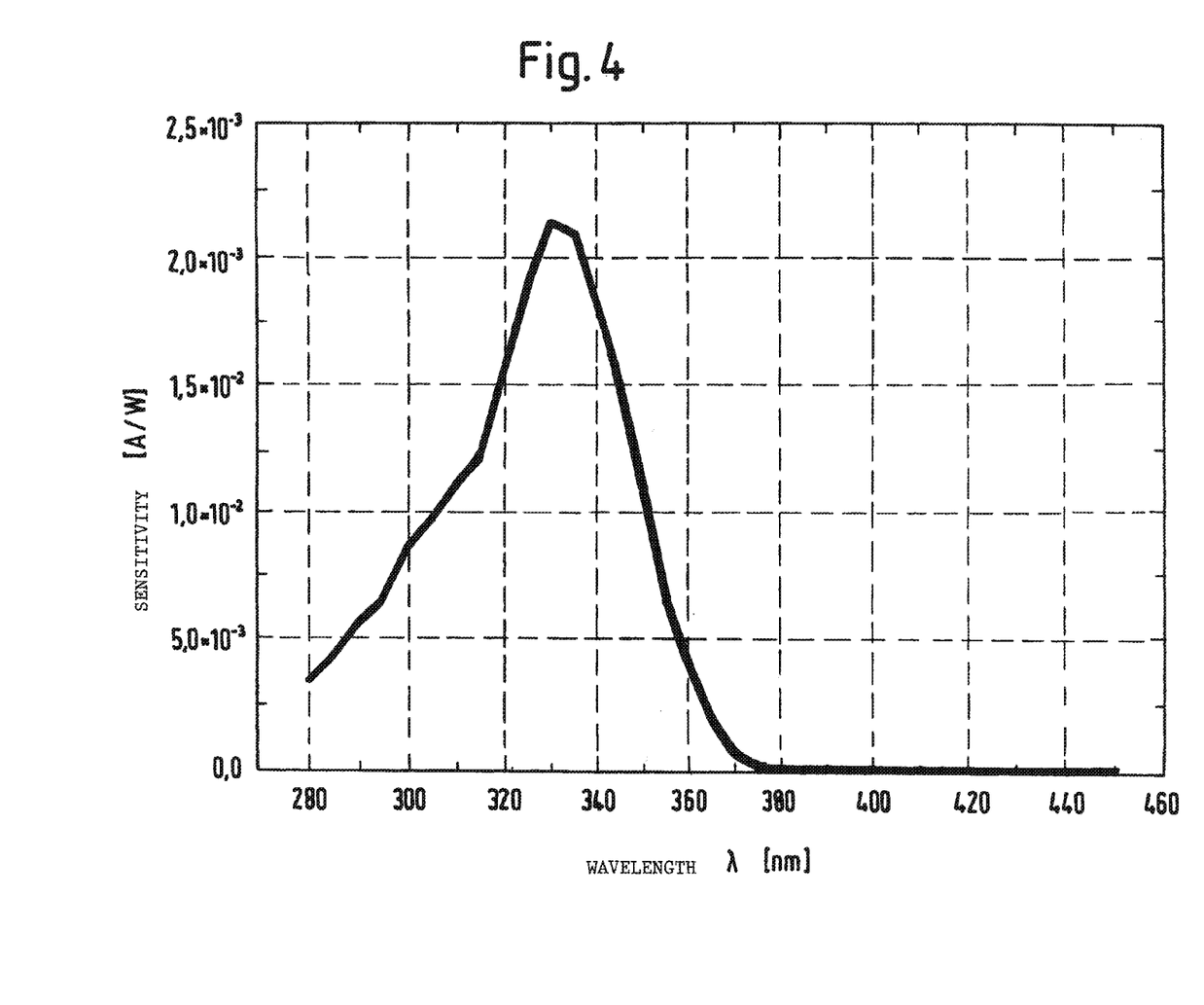
FIG. 4 shows an example of spectral sensitivity of a semiconductor component according to the invention.

FIG. 4 shows an example of a spectral characteristic curve for an embodiment of a semiconductor component according to the invention in a complete component. The figure shows the flow of current which is generated as a function of the incident wavelength. $TiO_2$ is in this case used as the metal chalcogenide compound semiconductor. It is clearly evident that the spectral sensitivity of the metal chalcogenide compound semiconductor used has a maximum at a wavelength of 330 nm.

Figure 5:
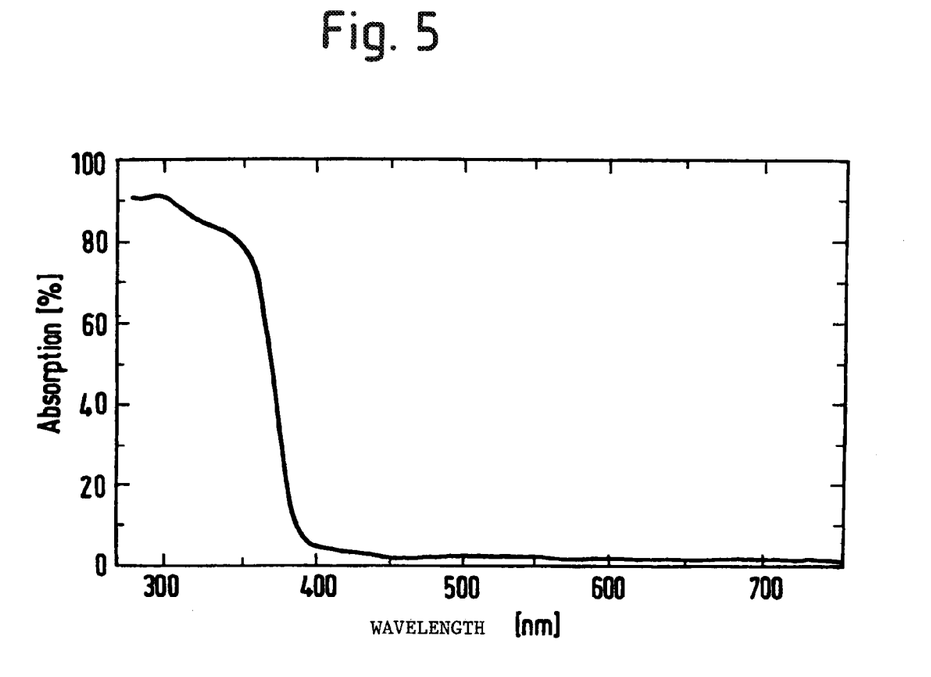
FIG. 5 shows an example of the selectivity of a compound semiconductor for UV radiation.

FIG. 5 shows a measurement curve in which the wavelength of the radiation which is incident on a semiconductor material according to the invention ($TiO_2$) is plotted on the X axis, and the absorption is plotted on the Y axis.

It is clearly apparent from this figure that in the UV region below 400 nm the absorption is very high, but above a wavelength of 400 nm (visible light) the absorption is very low. A semiconductor material having such a characteristic does not "see" the longer wavelengths and therefore has a high sensitivity exclusively for UV radiation.

The way in which the invention is implemented is not restricted to the preferred exemplary embodiments which have been presented above. Rather, it is conceivable to use a number of variants which make use of the semiconductor component according to the invention, of the electronic component according to the invention, of the sensor system according to the invention and of the method according to the invention for fabricating a semiconductor component, even with altogether different designs.

The invention claimed is:

1. A semiconductor component for the detection of UV radiation, comprising a layer stack having at least one semiconductor layer including at least one metal chalcogenide compound semiconductor as optical absorber material for UV radiation, and having a nanocrystalline semiconductor layer, one side of the at least one semiconductor layer is conductively connected to an electrical contact layer, and the other side of the at least one semiconductor layer is conductively connected to a metal layer which is at least partially transparent to UV radiation, wherein the at least one semiconductor layer forms a Schottky contact with the metal layer, wherein the at least one semiconductor layer is arranged on a substrate, and wherein at least one interlayer is arranged between the at least one semiconductor layer and the substrate.

2. The semiconductor component as claimed in claim 1, wherein the at least one semiconductor layer has at least one of a mixture and a layer sequence comprising at least two metal chalcogenide compound semiconductors.

3. The semiconductor component as claimed in claim 1 or 2, wherein the at least one nanocrystalline metal chalcogenide compound semiconductor is selected from the group consisting of $TiO_2$, $ZnO$, $ZnS$, $MgS$, $SnO_2$, $ZrO_2$, $PbO$, $NiO$, $Nb_2O_5$, $Ta_2O_5$, $Fe_2O_3$ and $In_2O_3$.

4. The semiconductor component as claimed in claim 1, wherein the at least one semiconductor layer has a thickness of less than 1 μm.

5. The semiconductor component as claimed in claim 1, wherein the at least one semiconductor layer substantially has a grain size of less than 20 nm.

6. The semiconductor component as claimed in claim 1, wherein the metal layer is arranged on the at least one semiconductor layer.

7. The semiconductor component as claimed in claim 1, wherein the contact layer comprises a conductive material.

8. The semiconductor component as claimed in claim 1, further comprising a substrate that is a glass body with at least one planar surface.

9. The semiconductor component as claimed in claim 1, wherein when the semiconductor component is irradiated with electromagnetic radiation, a current flows in the semiconductor component between the metal layer and the electrical contact layer.

10. The semiconductor component as claimed in claim 1, wherein the grain size is less than 10 nm.

11. The semiconductor component as claimed in claim 1, wherein the conductive material is selected from the group consisting of fluorine-doped $S_nO_2$, $S_nO_2/In_2O_3$, $ZnO$, aluminum-doped $ZnO$, zinc and aluminum.

12. The semiconductor component as claimed in claim 1, wherein the semiconductor layer is $TiO_2$.

13. The semiconductor component as claimed in claim 1, wherein the substrate is made from quartz glass.

14. The semiconductor component of claim 1, wherein the at least one semiconductor layer consists of the at least one nanocrystalline metal chalcogenide compound semiconductor.

15. A semiconductor component for the detection of UV radiation, comprising a layer stack having at least one semiconductor layer including at least one metal chalcogenide compound semiconductor as optical absorber material for UV radiation, and having a nanocrystalline semiconductor layer, one side of the at least one semiconductor layer is conductively connected to an electrical contact layer, and the other side of the at least one semiconductor layer is conductively connected to a metal layer which is at least partially transparent to UV radiation, wherein the at least one semiconductor layer forms a Schottky contact with the metal layer, wherein the at least one semiconductor layer is arranged on a substrate, and wherein the at least one semiconductor layer is doped with at least one of niobium and tantalum.

16. A semiconductor component for the detection of UV radiation, comprising a layer stack having at least one semiconductor layer including at least one metal chalcogenide compound semiconductor as optical absorber material for UV radiation, and having a nanocrystalline semiconductor layer, one side of the at least one semiconductor layer is conductively connected to an electrical contact layer, and the other side of the at least one semiconductor layer is conductively connected to a metal layer which is at least partially transparent to UV radiation, wherein the at least one semiconductor layer forms a Schottky contact with the metal layer, and wherein the contact layer is arranged on a substrate, the at least one semiconductor layer is arranged on the contact layer, and the metal layer is platinum and is arranged on the at least one semiconductor layer.

17. A sensor system for electromagnetic radiation, comprising a layer stack having at least one semiconductor layer including at least one nanocrystalline metal chalcogenide compound semiconductor as optical absorber material for UV radiation, wherein one side of the at least one semiconductor layer is conductively connected to an electrical contact layer, and the other side of the at least one semiconductor layer is conductively connected to a metal layer which is at least partially transparent to UV radiation, wherein the at least one semiconductor layer forms a Schottky contact with the metal layer, wherein the at least one semiconductor layer is arranged on a substrate, and wherein at least one interlayer is arranged between the at least one semiconductor layer and the substrate.

18. The sensor system as claimed in claim 17, wherein the sensor system is in a portable appliance.

19. The sensor system as claimed in claim 18, wherein the portable appliance is at least one of the group consisting of a handheld appliance, a wearable watch, a badge, and a bicycle computer.

20. A sensor system for electromagnetic radiation, comprising a layer stack having at least one semiconductor layer including at least one metal chalcogenide compound semiconductor as optical absorber material for UV radiation, and having a nanocrystalline semiconductor layer, one side of the at least one semiconductor layer is conductively connected to an electrical contact layer, and the other side of the at least one semiconductor layer is conductively connected to a metal layer which is at least partially transparent to UV radiation, wherein the at least one semiconductor layer forms a Schottky contact with the metal layer; and a means for recording a cumulative dose of radiation.

21. The sensor system as claimed in claim 20, further comprising an evaluation means which determines a difference between the cumulative dose of radiation and a predeterminable value for a dose of radiation.

22. The sensor system as claimed in claim 21, wherein the evaluation means at least one of optically and acoustically indicates the difference automatically.

23. The sensor system as claimed in claim 21, wherein the evaluation means detects measured outliers of the dose of radiation.

24. The sensor system as claimed in claim 23, wherein the evaluation means does not take account of the outliers when adding up the cumulative dose of radiation.

25. The sensor system as claimed in claim 21, wherein the evaluation means has a correction means to convert an actual incident radiation cross section of the sensor system into an incident radiation cross section of a person.

* * * * *